US007178971B2

(12) United States Patent
Pong et al.

(10) Patent No.: US 7,178,971 B2
(45) Date of Patent: Feb. 20, 2007

(54) HIGH EFFICIENCY DRIVER FOR COLOR LIGHT EMITTING DIODES (LED)

(75) Inventors: Man Hay Pong, Hong Kong (CN); Franki Ngai Kit Poon, Hong Kong (CN); Joe Chui Pong Liu, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 737 days.

(21) Appl. No.: 10/017,661

(22) Filed: Dec. 14, 2001

(65) Prior Publication Data

US 2003/0112229 A1 Jun. 19, 2003

(51) Int. Cl.
*H01L 27/14* (2006.01)
*G05F 1/00* (2006.01)

(52) U.S. Cl. ...................................... 362/800; 315/291

(58) Field of Classification Search ................ 315/291, 315/307; 362/800; 307/139, 140
See application file for complete search history.

(56) References Cited

U.S. PATENT DOCUMENTS 6,014,322 A * 1/2000 Higashi et al. ............... 363/65
6,025,697 A * 2/2000 Long et al. ................. 320/125
6,072,280 A * 6/2000 Allen ..................... 315/185 S
6,320,330 B1 * 11/2001 Haavisto et al. ............ 315/291
6,333,861 B1 * 12/2001 Goodman .................... 363/20
6,359,392 B1 * 3/2002 He ............................ 315/291
6,369,525 B1 * 4/2002 Chang et al. ............... 315/300
6,371,637 B1 * 4/2002 Atchinson et al. .......... 362/555
6,388,393 B1 * 5/2002 Illingworth ................. 315/291
6,396,714 B2 * 5/2002 Kato .......................... 363/17
6,577,072 B2 * 6/2003 Saito et al. ............. 315/185 R
6,646,895 B1 * 11/2003 Jacobs et al. ............ 363/21.08
2001/0012209 A1 * 8/2001 Raddi et al. .................. 363/37
2002/0158590 A1 * 10/2002 Saito et al. ................. 315/291

* cited by examiner

*Primary Examiner*—David Vu
*Assistant Examiner*—Minh Dieu A
(74) *Attorney, Agent, or Firm*—Dickstein Shapiro LLP

(57) ABSTRACT

An efficient power driver for color light emitting diodes (LED) is disclosed for driving multiple LEDs for producing different desired colors. Such LED combinations comprising LEDs with different primary colors are suitable for implementing pixels in displaying a digitized image. This disclosed invention provides switching power conversion embodiments such that a single apparatus drives different color LEDs. Furthermore, the disclosed invention provides configurations with and without input to output isolation while enabling control of the current through each LED, for instance by an inductor or operating condition.

9 Claims, 15 Drawing Sheets

HIGH EFFICIENCY DRIVER FOR COLOR LIGHT EMITTING DIODES (LED)

FIELD OF THE INVENTION

This invention relates to the field of power converters, in particular to the field of power converters for Light Emitting Diodes (LED).

BACKGROUND OF THE INVENTION

Among many different types of electrical illuminating devices, Light Emitting Diode (LED) is becoming a popular light source increasing the utility of LEDs for many purposes including illumination. Light emitting diodes producing different colors, such as, red, blue and green LEDs are available. Combinations of these primary colors can produce almost any color enhancing LED use for many decorative lighting applications and illumination. A light emitting diode, being of small size, also has the potential to produce small size illumination apparatus, particularly with special power drivers to efficiently utilize them.

LEDs are well suited for implementing a color pixel in a digital image display by combining several LEDs to generate a range of desired colors at the pixel. In order to drive a color pixel consisting of three light emitting diodes each with one of the primary colors, typically requires three separate power supplies producing different voltage. Controlling these three power supplies separately enables the three LEDs to produce a desired color with a desired brightness. Most LEDs work at low voltages, typically 1.5V to 4 volt. Since red, blue and green LEDs all have different turn on or forward voltages, each of the power supplies must produce current at different voltages. Moreover, often a number of LEDs are connected in parallel in order to increase the brightness, thus requiring the power supply to provide a high enough current to drive the parallel LEDs.

A drawback of low-voltage high current power supplies is their low efficiency. This is because most switching power is supplied across an output diode having a forward voltage comparable to that of the intended LED load. Thus, voltage produced is shared between this diode and the LED and brings the efficiency down to nearly 50 percent with the high current producing high resistive losses.

A known method for avoiding the need for low-voltage power supply connects a number of LEDs in series so that the driving voltage is the sum of the voltage of each LED in connected in series. However, this arrangement reduces reliability because the failure of any one of the LEDs in the series arrangement results in the failure of the whole arrangement.

Moreover, it is desirable to have a single power supply rather than three separate ones for the three primary colors. However, as indicated above, LEDs corresponding to the three primary colors correspond to different forward voltage drops. Typically, a linear driver in placed in series with LED of each color while the series connection is connected to a single constant voltage power source. The driver takes up the voltage difference between the power source and the LED. However, this method is exhibits great power dissipation and low efficiency. The efficiency of this method is only around 50 percent as the voltage drop across the driver is often comparable to the forward voltage of the LED. An arrangement with such low efficiency produces significant heat resulting in the need for a heat sink increasing product size while reducing reliability.

SUMMARY OF THE INVENTION

Apparatus and method for providing power to multiple light emitting diodes (LEDs), including those corresponding to the three primary colors, are disclosed. The apparatus provides an integrated solution to drive the three types of color LEDs by using the LED itself as a rectifying device in a switching power converter. Furthermore, the apparatus does not require a dissipative element, e.g., a linear driver resulting in energy efficient operation due to lower dissipation than known power supplies. Various embodiments of the invention provide simple non-isolated power conversion as well as isolated configuration for off-line operation. Consequently, known off-line power converter configuration such as forward and flyback converters are compatible with the disclosed apparatus. The brightness of each of the three colors can be modulated by a passive element, the duty cycle or the switching frequency resulting in a versatile and highly efficient power conversion apparatus with fewer components and smaller size than known designs.

The disadvantages of known power converters for LEDs are overcome by the embodiments of this invention. This and other advantages of a reliable power supply to drive multiple (typically three) color LEDs in an energy efficient manner by delivering current at low voltage with high efficiency are enabled by embodiments of the invention described in the following detailed description.

DETAILED DESCRIPTION OF THE INVENTION

The invention is illustrated with the aid of various example and exemplary embodiments. The embodiments are categorized into two types, viz., non-isolated and isolated configurations. Non-isolated configurations do not provide isolation between the input and the output while isolated configurations isolate the input and output through transformers. Non-isolated configurations will be described first followed by isolated configuration.

In each configuration a desired color is generated by combination of three primary colors, although such an arrangement is not required for practicing the invention. Accordingly, each configuration typically has three LEDs, or three sets of LEDs, producing primary colors blue, red and green. Combinations of different brightness of the colors produced by respective LEDs in a given configuration produce a variety of colors. Brightness of a LED is varied by varying the current through the LED. The described configurations enable modulation of current through the devices to produce various combinations of the primary colors.

Non-isolated Configurations

Figure 1:
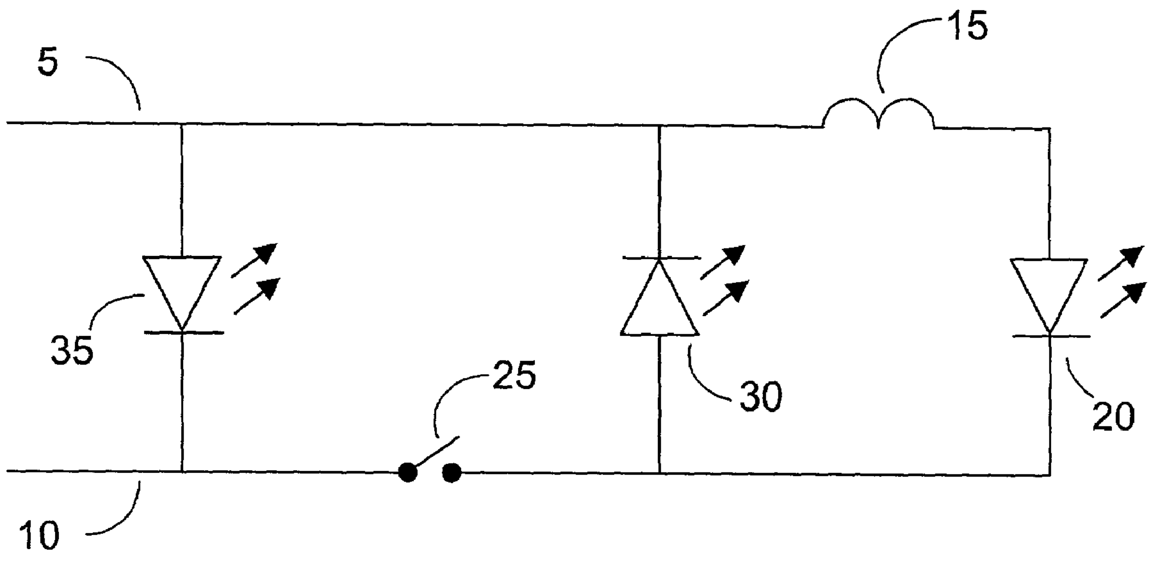
FIG. 1 illustrates an embodiment of the invention enabling modulation of the current through less than all of the LEDs.

FIG. 1 illustrates an embodiment of the invention enabling modulation of the current through less than all of the LEDs supplied by the power converter. FIG. 1 shows input terminals 5 and 10 (advantageously connected to a DC power source) with input terminal 5, for instance having positive polarity, coupled to inductor 15 that is in turn coupled to the anode of light-emitting diode LED 20 of one primary color, say red. The cathode of LED 20 is then coupled to switch 25 to complete the circuit with negative terminal 10. LED 30, typically but not necessarily providing a different primary color, has its cathode coupled to positive input terminal 5 and its anode coupled to switch 25. LED 35, for instance providing the color blue, is coupled directly across input terminals 5 and 10 with its anode coupled to positive terminal 5 and its cathode coupled to negative terminal 10.

Notably each LED can, without loss of generality, be replaced by a series or parallel combination of various devices that, in combination, provide similar unidirectional current paths.

Figure 2:
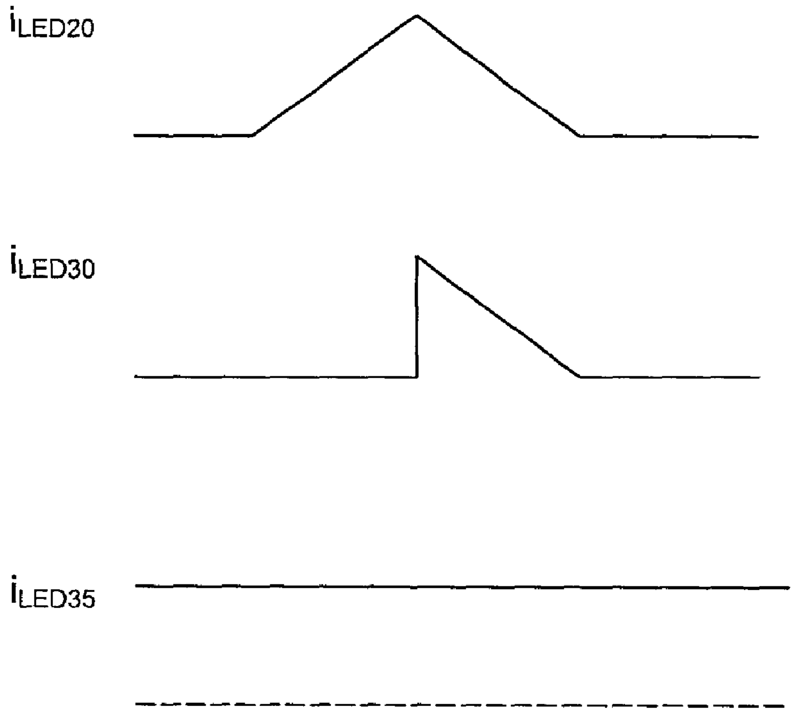
FIG. 2 presents exemplary current waveforms corresponding to operations in the discontinuous mode corresponding to the embodiment illustrated in FIG. 1.
Figure 3:
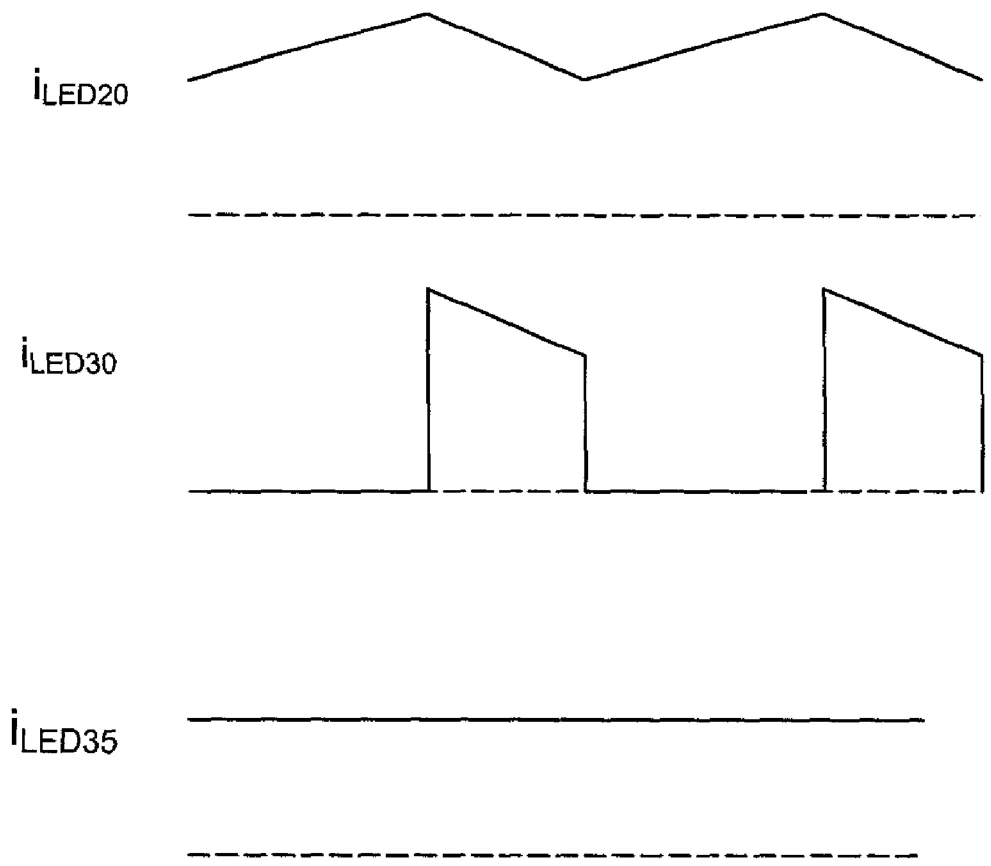
FIG. 3 presents exemplary current waveforms corresponding to operations in the continuous mode corresponding to the embodiment illustrated in FIG. 1.

The embodiment illustrated in FIG. 1 operates as described next. Switch 25 turns on and off at a high frequency. When switch 25 is turned on, current rises for a time-period with the same current flowing through LED 20. When switch 25 is turned off, current through the inductor 25 flows through LED 30. LED 35 being directly connected across the input experiences a constant current flow through it. The resulting current waveform for each LED is shown in FIG. 2. For suitable combinations of the inductance and the switching frequency, the inductor current does not decrease to zero with the apparatus operating in a continuous mode. Thus, with high enough inductance of inductor 15 or switching frequency of switch 25, continuous mode operation results. FIG. 3 shows the current waveforms corresponding to the continuous mode operation.

Current waveforms in FIG. 2 show the current through the three LEDs in the discontinuous mode. The waveforms are different reflecting the different brightness of each LED. In fact the relative brightness of LED 20 and LED 30 can be shown by the ratio of current $$\frac{i_{LED20}}{i_{LED30}} = \frac{V_{F30} + V_{in}}{V_{in} - V_{F20}} \qquad \text{eqn 1}$$

where $V_{in}$ is the input voltage, $V_{F20}$, $V_{F30}$ are the respective LED forward voltages. Changing the input voltage $V_{in}$ allows varying the ratio of the current through LEDs 20 and 30. A front-end converter or a variable voltage source provides a variable $V_{in}$ for adjusting the relative brightness to produce different colors.

Current waveforms in FIG. 3 show the current through the three LEDs in the continuous mode. The relative brightness of LED 20 and LED 30 can be shown by the ratio of their respective currents:

$$\frac{i_{LED20}}{i_{LED30}} = \frac{1}{1 - D} \qquad \text{eqn 2}$$

where D is the duty cycle. The current ratio can be adjusted by the duty cycle. This can be coordinated with a variable input voltage enables further color variation.

Current through LED 35 is dependent on the input voltage and the inherent device characteristic since it is coupled to the input terminals. Thus, the disclosed embodiment provides no loss power conversion. There is no requirement for a dissipative element like the familiar linear driver enabling the converter to deliver all, or most of its energy to illumination with high operation efficiency. However, the use of resistors and other dissipative elements is compatible with the disclosed design.

Figure 4:
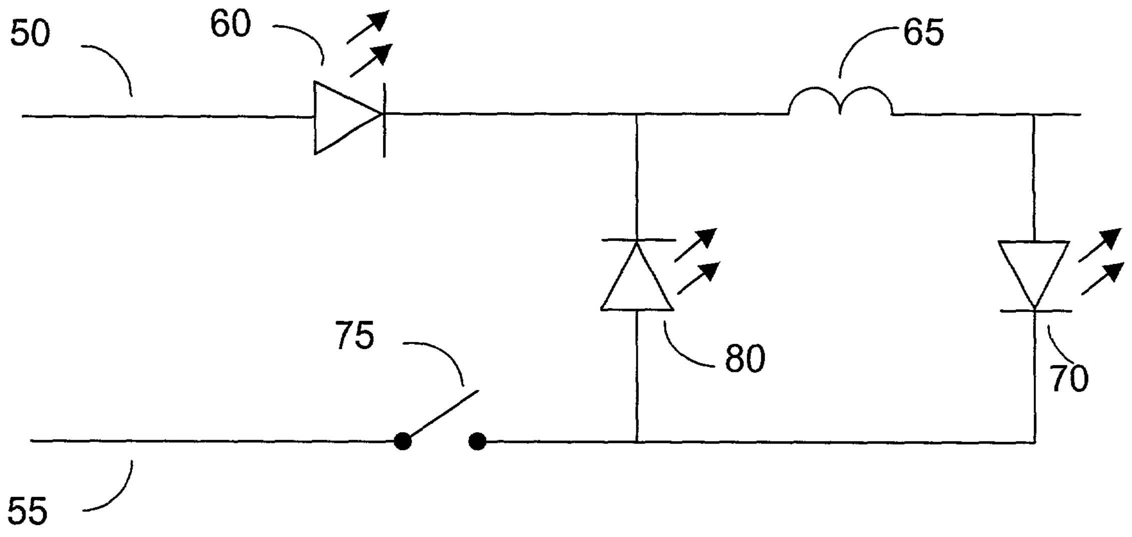
FIG. 4 illustrates an alternative embodiment that enables modulation of the current through all of the depicted LEDs.

FIG. 4 illustrates an alternative embodiment that enables modulation of the current through all of the depicted LEDs. The embodiment of FIG. 1 depicts one of the LEDs as directly coupled to the input power source and limited input voltage range. In the embodiment shown in FIG. 4, this constraint is removed since the third LED is arranged in series with the input power source resulting in control over the current through all LEDs. FIG. 4 illustrates, in part, a pair of input terminals 50 and 55 coupled to a DC source. Positive terminal 50 is coupled to the anode of LED 60 with its cathode coupled to inductor 65 that is further coupled to the anode of LED 70 producing another color. LED 70 has its cathode coupled to a switch 75. Next, switch 75 is coupled to negative input terminal 55. LED 80 capable of producing yet another color is coupled in parallel with the series combination of inductor 65 and LED 70.

Figure 5:
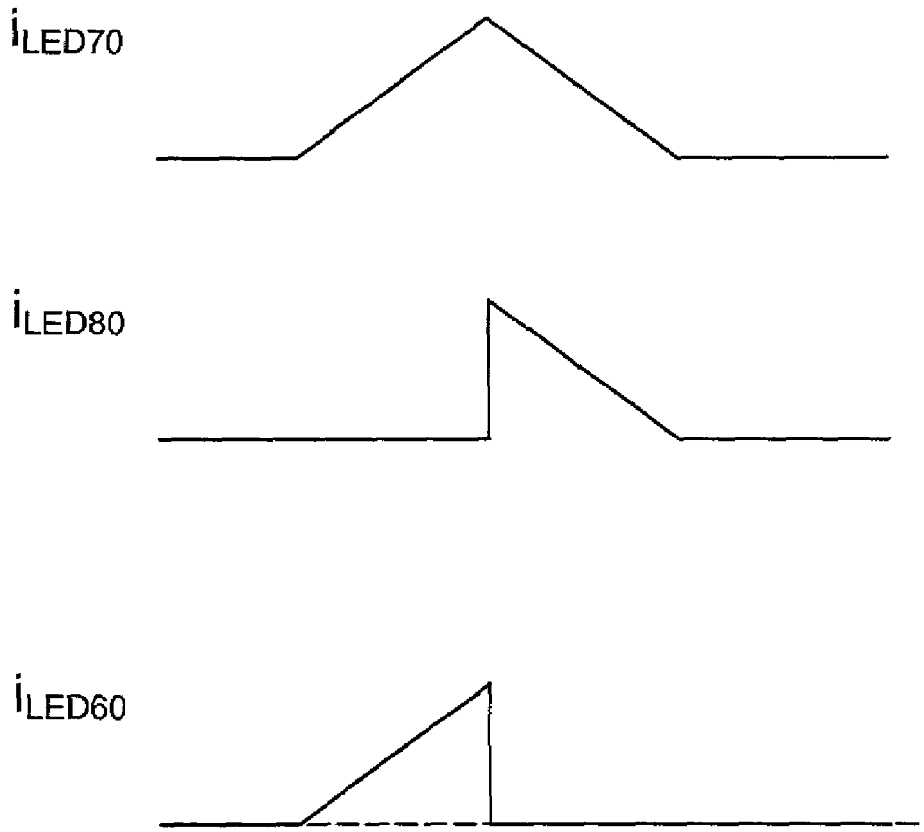
FIG. 5 presents exemplary current waveforms corresponding to operations in the discontinuous mode corresponding to the embodiment illustrated in FIG. 4.
Figure 6:
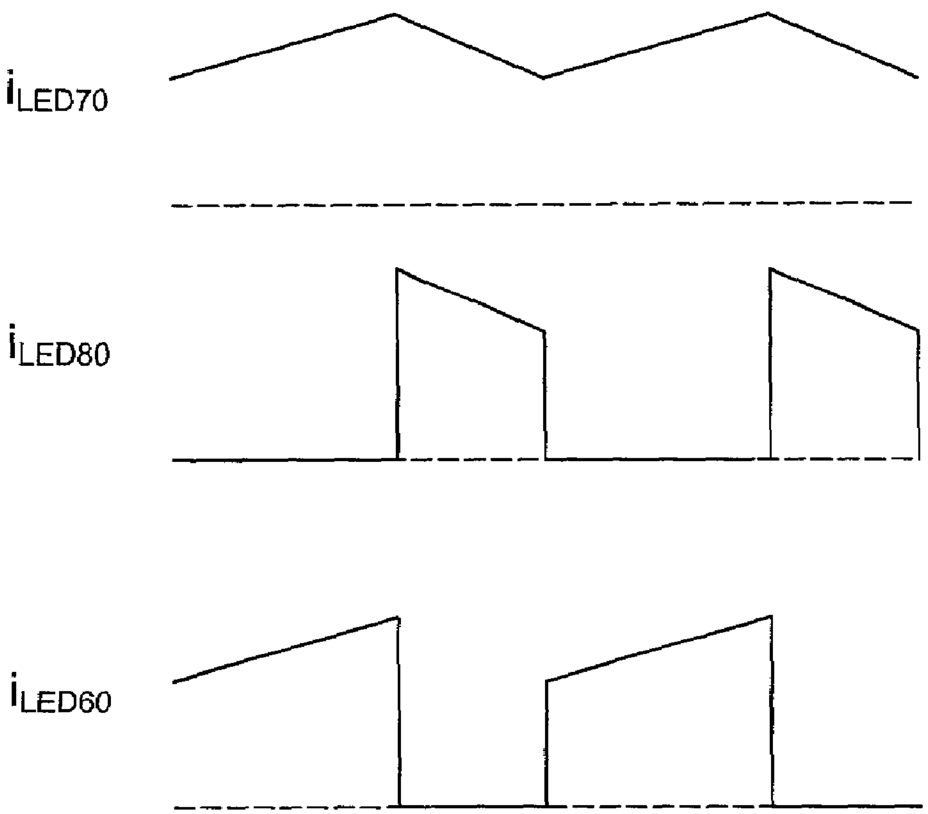
FIG. 6 presents exemplary current waveforms corresponding to operations in the continuous mode corresponding to the embodiment illustrated in FIG. 4.

The embodiment shown in FIG. 4 operates as follows. Switch 75, capable of turning on and off at a high frequency, when turned on causes current through inductor 65 to build up. When the switch 75 is turned off, current through inductor 65 flows through LED 80. FIG. 5 shows current waveforms through the three LEDs in the discontinuous mode. If the inductance of inductor 65 or the switching frequency is high enough, the converter operates in the continuous mode and the corresponding current waveforms are shown in FIG. 6.

The average current through the three LEDs 70, 80, and 60 respectively shown in FIG. 4 in the discontinuous mode is $$\frac{i_{LED60}}{i_{LED80}} = \frac{V_{F70} + V_{F80}}{V_{in} - V_{F60} - V_{F70}} \quad \text{eqn 3}$$

$$\frac{i_{LED70}}{i_{LED80}} = \frac{V_{F80} + V_{in} - V_{F60}}{V_{in} - V_{F60} - V_{F70}} \quad \text{eqn 4}$$

where $V_{in}$ is the input voltage, $V_{F60}$, $V_{F70}$ and $V_{F80}$ are the respective LED forward voltages.

Thus, the three currents through the three LEDs can be varied resulting in controlling the brightness by adjusting the input voltage.

Current waveforms in FIG. 6 show the current through the three LEDs in the continuous mode. The following equations describe the relative brightness of the LEDs:

$$\frac{i_{LED60}}{i_{LED80}} = \frac{D}{1 - D} \quad \text{eqn 5}$$

$$\frac{i_{LED70}}{i_{LED80}} = \frac{1}{D} \quad \text{eqn 6}$$

where D is the duty cycle. Each of the current ratios can be adjusted by varying the duty cycle with further coordination with a variable input voltage to control LED produced color.

Figure 7:
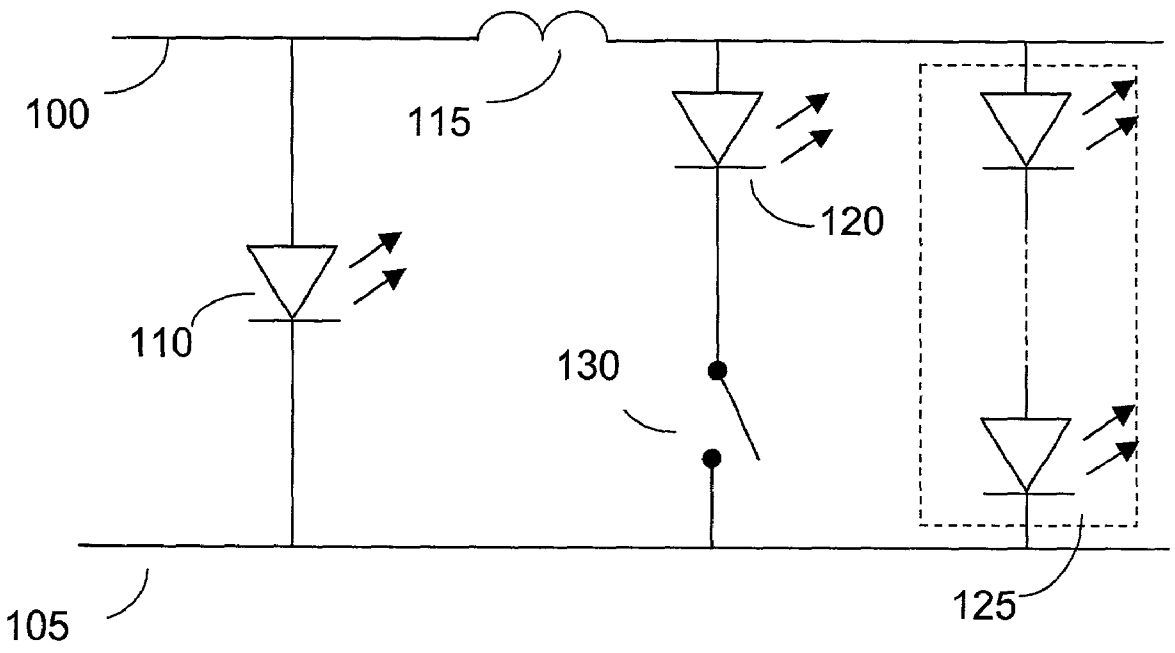
FIG. 7 illustrates an alternative embodiment of the invention that allows only two of the three depicted LEDs to emit light at any given time.

FIG. 7 illustrates an alternative embodiment of the invention that allows only two of the three depicted LEDs to emit light at any given time. FIG. 7 illustrates a pair of input terminals 100 and 105 for connecting to a DC power source. Of course, modified alternative designs including rectification and the like would allow other sources of power to serve as input power as well. One or more LED, termed LED 110 is coupled directly across the positive and negative input terminals. LED 110 has brightness dependent on the input voltage and the inherent device characteristic. An inductor 115 coupled to positive terminal 100 is further coupled to the anode of LEDs 120 and 125. LED 120 has its cathode coupled a switch 130 that is further coupled to the negative terminal 105. LED 125 also has its cathode coupled to negative terminal 105. As previously mentioned, LED 125 may be replaced by a plurality of devices connected in series such that the total voltage when activated is higher than the magnitude of the input voltage.

Figure 8:
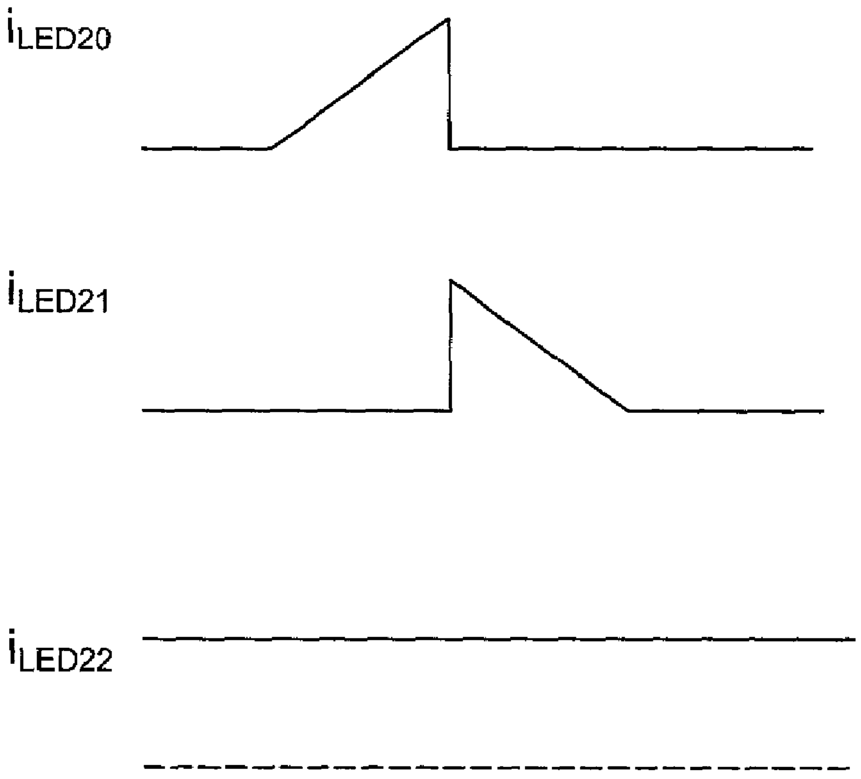
FIG. 8 presents exemplary current waveforms corresponding to operations in the discontinuous mode corresponding to the embodiment illustrated in FIG. 7.
Figure 9:
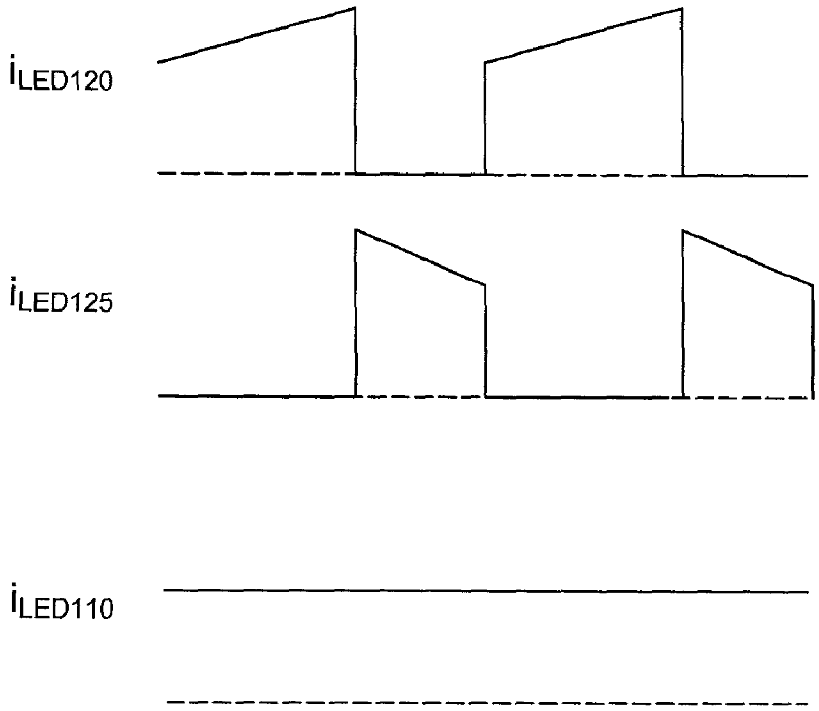
FIG. 9 presents exemplary current waveforms corresponding to operations in the continuous mode corresponding to the embodiment illustrated in FIG. 7.

Operation of the embodiment shown in FIG. 7 is similar to the previously described embodiments. Briefly, high frequency switch 130 turns on resulting in an increase in the current through inductor 115. When high frequency switch 130 turns off, the inductor 115 causes current to flow through LED 125. In this embodiment of the invention, the total voltage drop across LED 125 is higher than the input voltage at terminals 100 and 105. This arrangement decreases the current through LED 125 after switch 130 turns off. LED current waveforms for discontinuous operation are shown in FIG. 8. As mentioned previously in the context or other embodiments, if the inductance of inductor 115 or switching frequency of switch 130 is high enough the converter may operate in the continuous mode as is shown in FIG. 9.

Equations for currents in the discontinuous mode are shown as follows.

$$\frac{i_{LED120}}{i_{LED125}} = \frac{V_{F125} - V_{in}}{V_{in} - V_{F120}} \quad \text{eqn 7}$$

where $V_{in}$ is the input voltage while $V_{F125}$ and $V_{F120}$ are the respective LED forward voltages. As described earlier, the input voltage allows control over the current ratio.

Current waveforms in FIG. 9 show the current through the three LEDs in the continuous mode. The relative brightness of the LEDs is described by the following equation:

$$\frac{i_{LED120}}{i_{LED125}} = \frac{D}{1 - D} \quad \text{eqn 8}$$

where D is the duty cycle. The depicted current ratio can be adjusted by the duty cycle and further coordinated with a variable input voltage to modulate the color produced by the LEDs.

Figure 10:
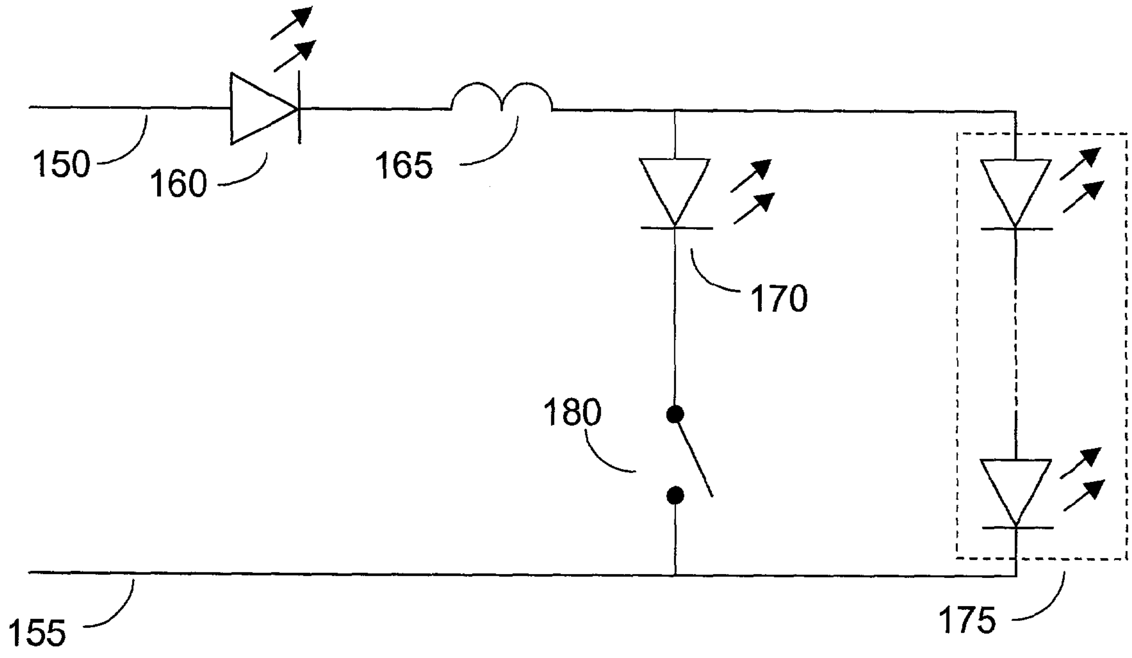
FIG. 10 illustrates yet another embodiment of the invention that allows the brightness of all the LEDs to be modulated.

FIG. 10 shows yet another embodiment of the invention that allows the brightness of all the LEDs to be modulated. In contrast to the embodiment illustrated in FIG. 7 with two LEDs having variable brightness, FIG. 10 enables changing the brightness of all three LEDs. To this end, FIG. 10 depicts LED 160 connected in series with the input voltage source to enable control over the current through all of the LEDs as described next.

FIG. 10 shows input terminals 150 and 155 connected to a DC source. Positive input terminal 150 is coupled to the anode of LED 160 while the cathode of LED 160 is coupled to inductor 165. Inductor 165 is further coupled to cathodes of LEDs 170 and 175. LED 175 is configured such that the total forward voltage is greater than the input voltage plus the forward voltage of LED 160. LED 175 has its cathode coupled to negative input terminal 155. LED 170 has its cathode coupled to a switch 180 which is further coupled to negative input terminal 155.

Figure 11:
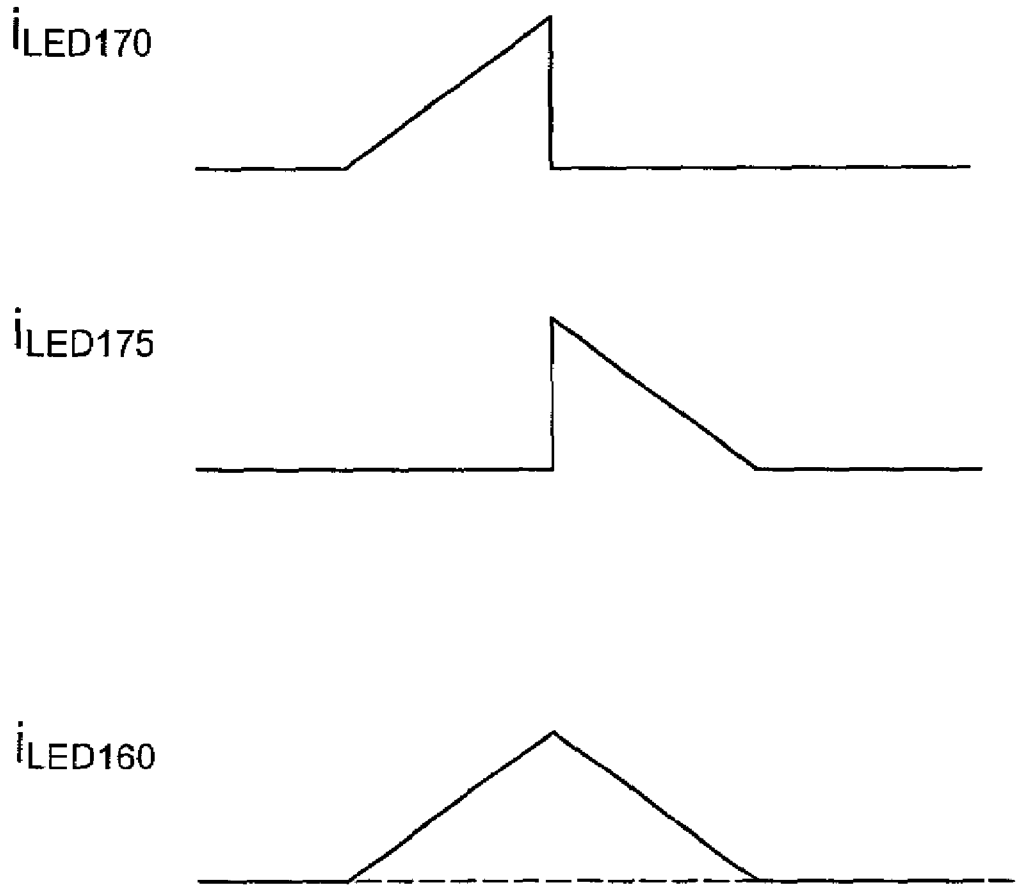
FIG. 11 presents exemplary current waveforms corresponding to operations in the discontinuous mode corresponding to the embodiment illustrated in FIG. 10.
Figure 12:
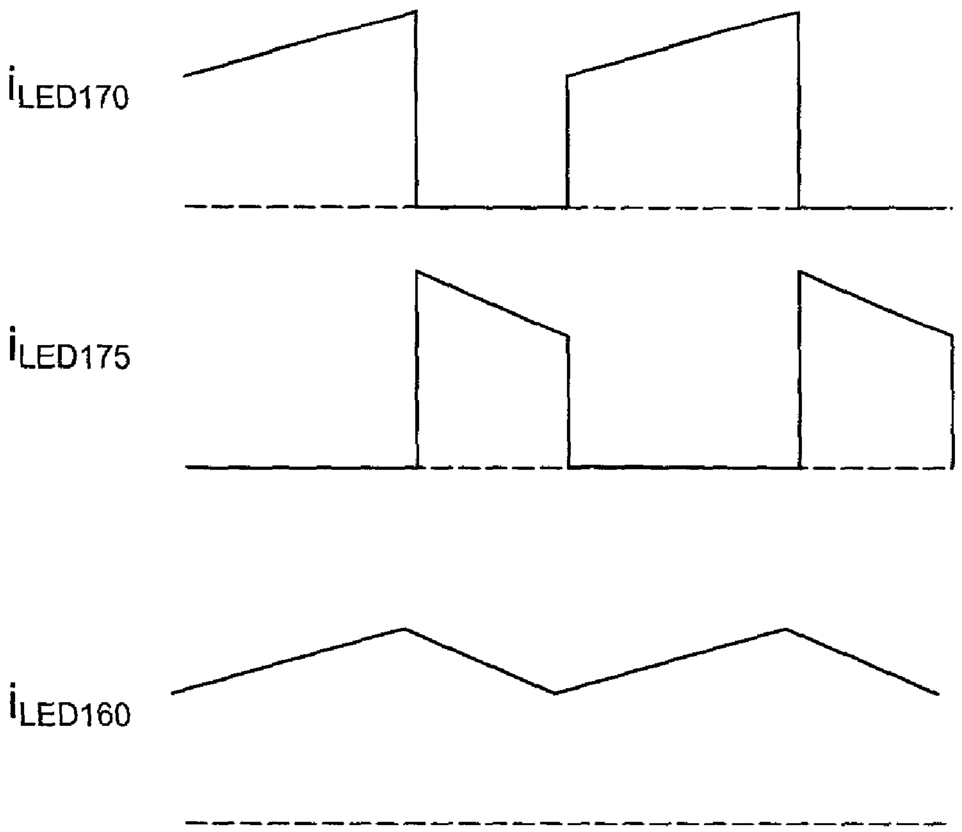
FIG. 12 presents exemplary current waveforms corresponding to operations in the continuous mode corresponding to the embodiment illustrated in FIG. 10.

The embodiment shown in FIG. 10 is believed to operate as described next. When high frequency switch 180 turns on current increases through inductor 165 connected in series circuit with LEDs 160 and 170. Turning switch 180 off directs current through inductor 165 and LED 175. Corresponding current waveforms for each of the three depicted LEDs in FIG. 10 are shown in FIG. 11 for discontinuous mode operation. FIG. 12 presents exemplary current waveforms corresponding to operations in the continuous mode. The average current through the three LEDs in the discontinuous mode can be analyzed as follows:

$$\frac{i_{LED170}}{i_{LED175}} = \frac{V_{F175} - V_{F160} - V_{in}}{V_{in} - V_{F160} - V_{F170}} \quad \text{eqn 9}$$

$$\frac{i_{LED160}}{i_{LED175}} = \frac{V_{F175} - V_{F170} - 2V_{F160}}{V_{in} - V_{F160} - V_{F170}} \quad \text{eqn 10}$$

where $V_{in}$ is the input voltage, $V_{F160}$, $V_{F170}$, $V_{F175}$ are the respective forwards voltages corresponding to LED 160, LED 170 and LED 175 respectively. The current ratios can be varied by the input voltage $V_{in}$.

Current waveforms in FIG. 12 show the current through the three LEDs in the continuous mode with the relative brightness of the LEDs described by the following equations:

$$\frac{i_{LED170}}{i_{LED175}} = \frac{D}{1-D} \quad \text{eqn 11}$$

$$\frac{i_{LED160}}{i_{LED175}} = \frac{1}{1-D} \quad \text{eqn 12}$$

where D is the duty cycle. The current ratio can be adjusted by the duty cycle. This can be further coordinated with a variable input voltage to exercise maximum color variation.

As illustrated by the equations above, varying the current through each LED 170, LED 175 and LED 160 allows modulation of its' respective brightness. As is readily noted, changing the duty cycle D and/or the input voltage enables such modulation.

The aforementioned four embodiments provide non-isolated configurations for LEDs producing primary colors, although the configurations are suitable for driving LEDs producing other colors as well.

Isolated Configurations

There are three embodiments in this section with one embodiment incorporating the forward type converter, another embodiment incorporating a flyback converter and yet another embodiment depictinguse of a center-tap forward converter for driving LEDs.

Figure 13:
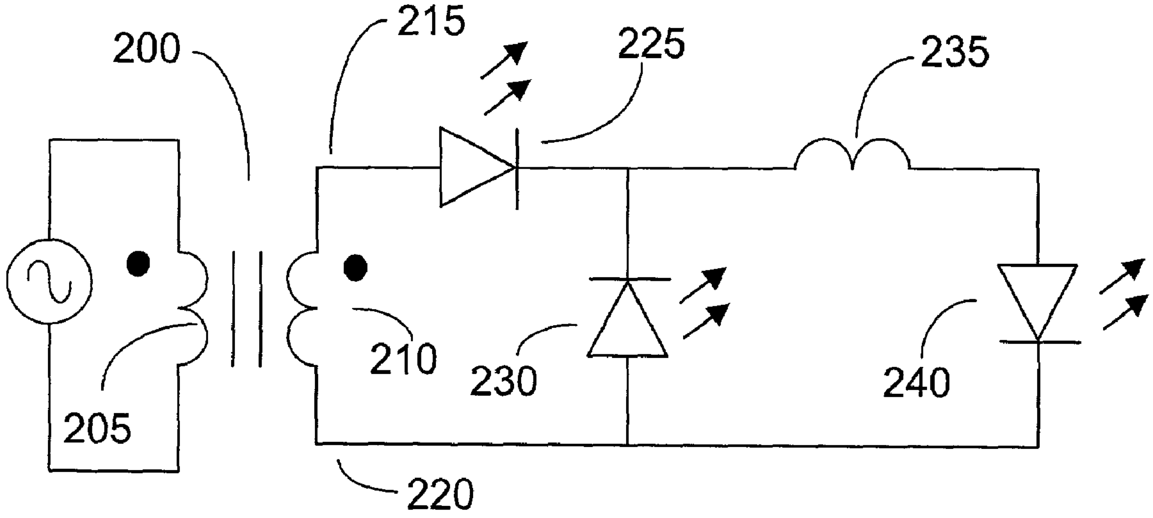
FIG. 13 shows an embodiment of the invention comprising a forward converter and isolation between input and output.

FIG. 13 shows an exemplary embodiment of the invention comprising a forward converter. FIG. 13 shows power transformer 200 having primary winding 205 and at least one secondary winding 210. Secondary winding 210 has two terminals 215 and 220. Terminal 215 is connected to the anode of LED 225 while terminal 220 is coupled to the anode of LED 230. The cathodes of LEDs 225 and 230 meet at a node that is further coupled to one end of inductor 235. The other end of inductor 235 connects to the cathode of LED 240 that, in turn, connects via its cathode to terminal 220 to complete the circuit.

Operation of the embodiment illustrated in FIG. 13 is described next. Primary winding 205 receives a series of pulses as the primary winding of the transformer of a forward converter, including known forward converters that induce, in response to the pulses at the primary side, alternating voltage pulses at secondary winding 210. In response to a positive voltage coupled to secondary winding 210, terminal 215 becomes positive in polarity. This voltage increases the current through inductor 235, and LEDs 225 and 240. When the induced voltage is negative then terminal 215 has negative polarity and LED 225 is reverse biased. Then, the current through inductor 235 flows through LED 230 instead of LED 225 in a manner similar to the operation of the embodiment of the invention presented in FIG. 4.

Advantageously, although not as a requirement for practicing the invention, each LED 225, 230 or 240 produces one of the three primary colors that in combination produce a desired color. Current through any of LEDs 225, 230 or 240 is modulated to produce a desired brightness with the combination of the three LEDs resulting in a desired color from a broad range of possible colors. The duty cycle and the input voltage determine the current through each of the LEDs 225, 230 or 240 as described previously in the context of FIG. 4. With no loss of generality it should be noted that each LED is replaceable by a combination of LEDs or other components producing a similar unidirectional current path.

Figure 14:
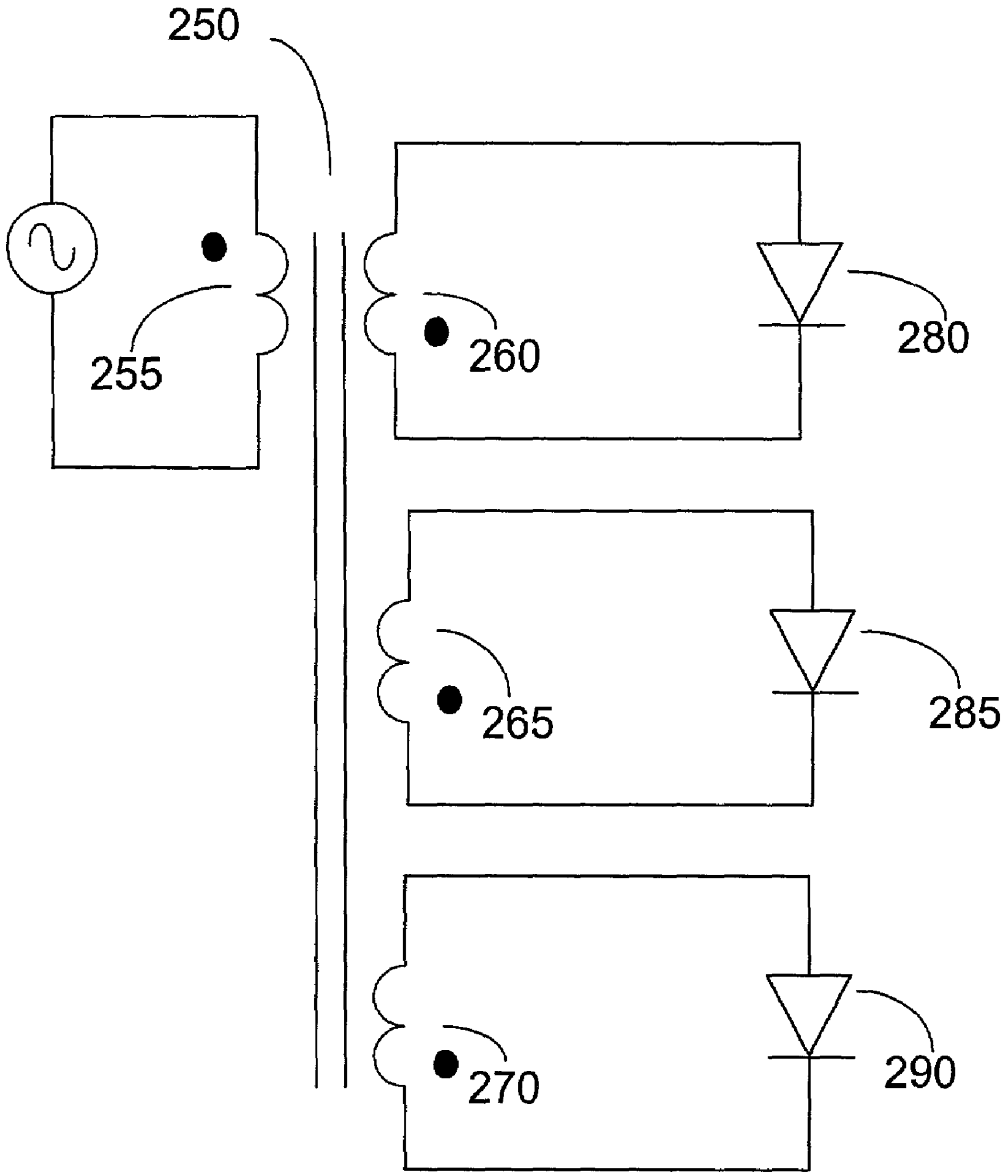
FIG. 14 shows an embodiment of the invention with isolation between input and output and comprising a flyback converter with a coupled inductor.

FIG. 14 shows another exemplary embodiment of the invention comprising a flyback converter with a coupled inductor 250. Coupled inductor 250 has a primary winding 255, and multiple secondary windings such as the shown secondary windings 265, 270 and 275. Winding 260 is coupled to LED 280, winding 265 is coupled to LED 285 and winding 270 is coupled to LED 290. As described previously, each of the LEDs 280, 285, and 290 produce one of the three primary colors that are combined to generate a desired color. In addition, the number of secondary windings can be further varied according to the number of colors required or LEDs driven by the common power converter.

Operation of the embodiment of the invention in FIG. 14 is described next with primary winding 255 coupled to a series of alternating square voltage pulses. This apparatus operates as a flyback converter such that when primary winding 255 is energized, LEDs coupled to corresponding secondary windings are reverse biased such that no energy is transferred to them since no current flows through them. When the voltage polarity across winding 255 reverses, energy stored in coupled inductor 250 is released to each LED. In practice this type of converter typically operates in the discontinuous mode when coupled to a front end AC to DC diode-bridge. A series of suitable alternating square voltage pulse for primary winding 255 enable the current drawn from the AC source to follow the alternating voltage to obtain a high power factor.

Brightness of the LEDs can be varied to create different colors combinations as described previously with the currents through the various LEDs depending on the number of turns of the associated secondary winding and the duty cycle.

Figure 15:
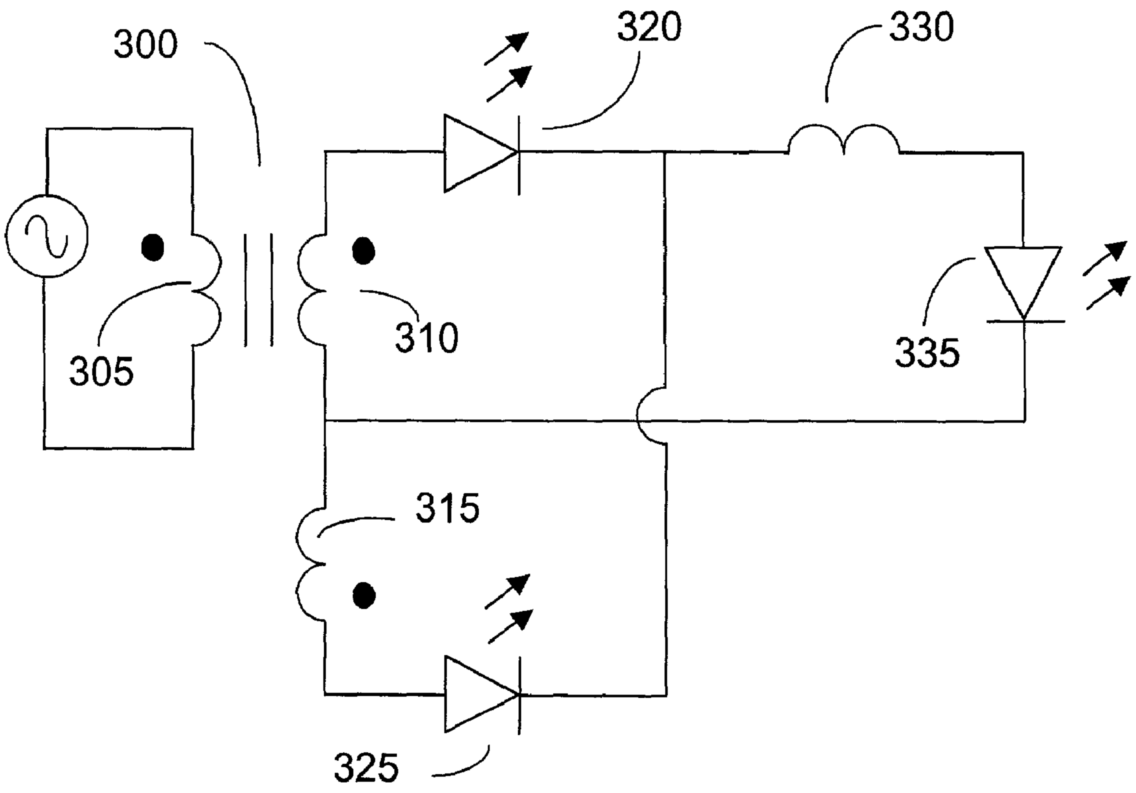
FIG. 15 shows an illustrative embodiment of the invention with isolation between input and output and using a center-tapped transformer.

FIG. 15 shows another illustrative embodiment of the invention employing a center-tapped transformer. Illustrated center-tapped converter comprises transformer 300 with a primary winding 305, and secondary windings 310 and 315 coupled together at a node. Secondary winding 310 is coupled to the anode of LED 320 and secondary winding 315 is coupled to the anode of LED 325. LEDs 320 and 325 have their cathodes connected together and to one end of inductor 330. Moreover, LED 335 has its anode coupled to inductor 330 and its cathode coupled to the node joining secondary windings 310 and 315. Advantageously, LEDs 315, 320 and 335 emit light of different colors to enable generation of additional colors by combining their respective emissions.

Operation of the embodiment of the invention in FIG. 15 is described next. Primary winding 305, possibly driven by half bridge circuits or full bridge circuits like most forward converters, receives a series of voltage pulses resulting in energizing secondary windings 310 and 315. Current from secondary windings 310 and 315 flows to inductor 330 via either LED 320 or LED 325 and then to LED 335. The current through the each of LEDs 320, 325 and 335 is modulated by varying the ratio of secondary and primary windings, switching frequency, duty cycle, the input voltage, and the value of inductor 330. Thus, suitably adjusting the current through an LED results in producing a desired brightness and in combination with the color produced by other LEDs generates a desired color.

Although FIGS. 13–15 include an alternating power source, this is not intended to indicate sinusoidal alternating power sources only. Indeed square waves or even irregular waveforms capable of driving the secondary windings are intended to be included by the illustrative depiction of an alternating power source. The alternating power source includes one or more of a switching forward power converter, a transformer, a switching flyback power converter, a switching bridge power converter, and the like.

The aforementioned embodiments include an inductor coupled in series with a first LED with a second light emitting diode coupled in parallel to the inductor and the first LED. The second LED is oriented so that it is reverse biased when a power source drives a current through the inductor and the first LED. Additionally, a switch controls the connection of the inductor and the first LED to the power source. Furthermore, additional LEDs can be added, for instance a third LED coupled, in parallel to the first light emitting diode, to a first terminal and a second terminal of the power source. Alternatively, a third light emitting diode is coupled in series to the first light emitting diode and to a first terminal and a second terminal of the power source.

Another embodiment comprises an inductor coupled in series with a first LED, a switch controlling a connection of the inductor and the first LED to a power source, in turn, connected in series to the inductor via the switch and a second LED. The second LED has a forward voltage higher than input voltage across the power source and is connected in parallel to the switch and the first LED. To complete the picture, the second LED is coupled in series with the inductor and the power source. As before, additional LEDs can be added, for instance, by using a bank of LEDs instead of a single LED or, for instance, a third light emitting diode coupled in parallel to the first and second input terminals of the power source. The third light emitting diode can also be coupled in series with the first or second terminals of the power source.

If isolation between the input and output side is desired then magnetic coupling is incorporated in the designs. An example apparatus includes a switching forward power converter with a transformer, a secondary winding coupled to the transformer, an LED coupled to the secondary winding and an inductor. Another LED is also connected to the inductor and another terminal of the secondary winding with a third LED coupled in parallel with the series combination of the second light emitting diode and the inductor. The operation of the configuration is as described for FIGS. 13–15.

Another isolation providing design uses a switching flyback power converter, a transformer, a plurality of secondary windings coupled to the transformer, and an LED coupled to the secondary windings. In addition, the apparatus can incorporate a bridge rectifier for converting an alternating current to a direct current with means to operate the flyback converter to operate in discontinuous mode with current delivered by an alternating current source with phase angle following a corresponding alternating voltage.

This is in accordance with the operation of a discontinuous flyback converter. With a fixed duty cycle the input current is proportional to the input voltage making the converter input impedance resistive. If the input voltage is derived from a bridge rectifier driven by a sinusoidal voltage then the input current will also be sinusoidal in phase with the driving voltage. The resulting output LED currents may also be sinusoidal but their brightness variation at line frequency will not be perceived by human eye.

Yet another configuration comprises a switching bridge power converter, a transformer, two or more secondary windings such that a first terminal of the first secondary winding has the opposite polarity to that of a first terminal of the second secondary winding. Two LEDs, coupled together at their cathodes, are connected to an inductor. The anode of the first light emitting diode is connected to the first terminal of the first secondary winding and the anode of the second light emitting diode being connected to the first terminal of the second secondary winding. To complete the design, the inductor coupled to the cathodes of the LEDs is further coupled to a second terminal of the first secondary winding and a second terminal of the second secondary winding via a third light emitting diode.

It will be appreciated that the various features described herein may be used singly or in any combination thereof. Thus, the present invention is not limited to only the embodiments specifically described herein. While the foregoing description and drawings represent an embodiment of the present invention, it will be understood that various additions, modifications, and substitutions may be made therein without departing from the spirit and scope of the present invention as defined in the accompanying claims. In particular, it will be clear to those skilled in the art that the present invention may be embodied in other specific forms, structures, and arrangements, and with other elements, and components, without departing from the spirit or essential characteristics thereof. One skilled in the art will appreciate that the invention may be used with many modifications of structure, arrangement, and components and otherwise, used in the practice of the invention, which are particularly adapted to specific environments and operative requirements without departing from the principles of the present invention. The presently disclosed embodiment is therefore to be considered in all respects as illustrative and not restrictive, the scope of the invention being indicated by the appended claims, and not limited to the foregoing description.

We claim:

1. An apparatus to provide power to a plurality of light emitting diodes for producing a desired color and brightness, the apparatus comprising:

- an inductor coupled in series with a first light emitting diode;
- a second light emitting diode coupled in parallel to the inductor and the first light emitting diode such that the second light emitting diode is reverse biased when a power source drives a current through the inductor and the first light emitting diode; and
- a switch controlling the connection of the inductor and the first light emitting diode to the power source.

2. The apparatus recited in claim 1 further comprising: a third light emitting diode coupled, in parallel to the first light emitting diode, to a first terminal and a second terminal of the power source.

3. The apparatus recited in claim 1 further comprising: a third light emitting diode coupled, in series to the first light emitting diode, to a first terminal and a second terminal of the power source.

4. The apparatus recited in claim 1, wherein the inductor and the first light emitting diode are coupled to a first terminal and a second terminal of the power source respectively.

5. The apparatus recited in claim 1, wherein the switch is coupled, in series to the first light emitting diode, to a first terminal and a second terminal of the power source.

6. The apparatus recited in claim 1 further comprising a third light emitting diode coupled to a first terminal and a second terminal of the power source.

7. An apparatus to provide power to drive a plurality of light emitting diodes, the apparatus comprising:

- an inductor coupled in series with a first light emitting diode;

a switch controlling a connection of the inductor and the first light emitting diode to a power source; and a first terminal and a second terminal of the power source connected in series to the inductor via the switch and at least one second light emitting diode, the at least one second light emitting diode having a forward voltage higher than input voltage aeross the first and second terminals;

wherein the second light emitting diode is connected in parallel to the switch and the first light emitting diode, and wherein the second light emitting diode is coupled in series with the inductor and the power source.

8. The apparatus recited in claim 7 further comprising: a third light emitting diode coupled in parallel to the first and second input terminals.

9. The apparatus recited in claim 7 further comprising: a third light emitting diode coupled in series with the first or second terminals.

* * * * *